(12) United States Patent
Wakimoto et al.

(10) Patent No.: US 9,018,633 B2
(45) Date of Patent: Apr. 28, 2015

(54) SEMICONDUCTOR DEVICE

(71) Applicant: Fuji Electric Co., Ltd., Kawasaki-shi (JP)

(72) Inventors: Hiroki Wakimoto, Matsumoto (JP); Haruo Nakazawa, Matsumoto (JP); Yasushi Miyasaka, Nagano (JP)

(73) Assignee: Fuji Electric Co., Ltd. (JP)

( * ) Notice: Subject to any disclaimer, the term of this patent is extended or adjusted under 35 U.S.C. 154(b) by 115 days.

(21) Appl. No.: 13/964,219

(22) Filed: Aug. 12, 2013

(65) Prior Publication Data

US 2014/0061672 A1 Mar. 6, 2014

Related U.S. Application Data

(63) Continuation of application No. PCT/JP2011/070909, filed on Sep. 13, 2011.

(30) Foreign Application Priority Data

Mar. 14, 2011 (JP) .................................. 2011-055946

(51) Int. Cl.
*H01L 29/15* (2006.01)
*H01L 29/16* (2006.01)
(Continued)

(52) U.S. Cl.
CPC ....... *H01L 29/1608* (2013.01); *H01L 29/41766* (2013.01); *H01L 29/0619* (2013.01); *H01L 29/402* (2013.01); *H01L 29/408* (2013.01); *H01L 29/41741* (2013.01); *H01L 29/47* (2013.01); *H01L 29/475* (2013.01); *H01L 29/7395* (2013.01); *H01L 29/0661* (2013.01); *H01L 29/2003* (2013.01); *H01L 29/7827* (2013.01)

(58) Field of Classification Search
USPC ....................................................... 257/76, 77
IPC .......... H01L 29/41766,29/47, 29/475, 29/2003, H01L 29/1608
See application file for complete search history.

(56) References Cited

U.S. PATENT DOCUMENTS 4,624,004 A * 11/1986 Calviello ........................ 257/276
5,236,854 A * 8/1993 Higaki ............................ 438/167
(Continued)

FOREIGN PATENT DOCUMENTS

JP 04-332173 A 11/1992
JP 08-306937 A 11/1996
(Continued)

*Primary Examiner* — Victor A Mandala
(74) *Attorney, Agent, or Firm* — Rossi, Kimms & McDowell LLP

(57) ABSTRACT

A semiconductor device includes an active region in which current flows when the semiconductor device is in an on state and a breakdown voltage structure portion which surrounds the active region. In the active region, a MOS gate structure includes, a p well region, an $n^+$ source region, a gate electrode, and a source electrode is provided on the front surface of a semiconductor substrate. A drain electrode which comes into contact with an $n^-$ drift region is provided from the rear surface to the side surface of the semiconductor substrate. The drain electrode forms a Schottky contact with the $n^-$ drift region which is the semiconductor substrate. In the breakdown voltage structure portion, a leakage current reducing layer reduces leakage current from the outer circumferential edge of the semiconductor substrate and is provided at least at the outer circumferential edge of the semiconductor substrate.

18 Claims, 14 Drawing Sheets

(51) Int. Cl.
*H01L 29/06* (2006.01)
*H01L 29/40* (2006.01)
*H01L 29/739* (2006.01)
*H01L 29/20* (2006.01)
*H01L 29/78* (2006.01)
*H01L 29/417* (2006.01)
*H01L 29/47* (2006.01)

(56) References Cited

U.S. PATENT DOCUMENTS

2007/0235745 A1* 10/2007 Hayashi et al. ............... 257/94
2009/0090920 A1* 4/2009 Endo et al. .................... 257/77
2010/0224886 A1 9/2010 Iwamuro
2010/0252863 A1* 10/2010 Kawasaki ..................... 257/192
2012/0007114 A1* 1/2012 Seo et al. ...................... 257/94

FOREIGN PATENT DOCUMENTS

| JP | 11-133365 A | 5/1999 |
| JP | 2002-299624 A | 10/2002 |
| JP | 2006-303410 A | 11/2006 |
| JP | 2009-123914 A | 6/2009 |
| JP | 2010-206002 A | 9/2010 |
| JP | 2010-206109 A | 9/2010 |
| JP | 2010-258327 A | 11/2010 |

* cited by examiner

SEMICONDUCTOR DEVICE

BACKGROUND OF THE INVENTION

A. Field of the Invention

The present invention relates generally to a semiconductor device.

B. Description of the Related Art

In recent years, in a semiconductor power conversion device, much attention has been paid to the application of a bidirectional switching element to a direct link conversion circuit, such as a matrix converter. The matrix converter performs, for example, AC (alternating current)/AC conversion, AC/DC (direct current) conversion, and DC/AC conversion. Much attention has been paid to the application of the bidirectional switching element to the direct link conversion circuit since the application can reduce the size and weight of a circuit, improve efficiency and response, and reduce costs.

The matrix converter has a higher power conversion efficiency than an inverter/converter. In general, while the inverter/converter generates a DC intermediate voltage from an AC power supply and converts the intermediate voltage into an AC voltage, the matrix converter does not generate the intermediate voltage, but directly generates AC voltage from the AC power supply.

In addition, the lifespan of the inverter/converter is determined by the lifespan of an electrolytic capacitor since the electrolytic capacitor is used as a capacitor for generating the intermediate voltage. In contrast, in the matrix converter, the capacitor for generating the intermediate voltage does not need to be provided between the AC power supply and an AC voltage output unit. Therefore, it is possible to avoid the problems of the inverter/converter.

FIG. 11 is an equivalent circuit diagram illustrating the matrix converter. FIG. 12 is an equivalent circuit diagram illustrating a reverse blocking semiconductor device according to the related art. FIG. 13 is a characteristic diagram illustrating the electrical characteristics of the reverse blocking semiconductor device according to the related art. As illustrated in FIG. 12, power semiconductor element 101 applied to the matrix converter illustrated in FIG. 11 is a reverse blocking semiconductor device with a structure in which two transistors 102 having a reverse breakdown voltage are connected in anti-parallel. As illustrated in FIG. 13, the reverse blocking semiconductor device has a general forward breakdown voltage (a positive voltage is applied to the drain on the basis of source potential) and also has a reverse breakdown voltage (a negative voltage is applied to the drain on the basis of the source potential) with the same level as the forward breakdown voltage.

FIG. 14 is a cross-sectional view illustrating a reverse blocking semiconductor device according to the related art. The reverse blocking semiconductor device illustrated in FIG. 14 has a MOS gate structure including p well region 202, $n^+$ source region 203, gate oxide film 204, gate electrode 205, and source electrode 206 on a front surface of a semiconductor substrate which is $n^-$ drift region 201. P-type region (hereinafter, referred to as a field plate (FP)) 207 is provided at the end of the front surface of the semiconductor substrate. P-type region 208 which comes into contact with FP 207 and extends from the front surface to the rear surface of the semiconductor substrate is provided on the side surface of the semiconductor substrate. Drain electrode 209 which comes into contact with $n^-$ drift region 201 is provided on the rear surface of the semiconductor substrate.

As the reverse blocking semiconductor device according to the related art, a device has been proposed in which a MOS gate structure including a gate electrode and an emitter electrode is provided in a surface layer of an $n^-$ drift layer, which is a semiconductor substrate having a GaN semiconductor or a SiC semiconductor as a main semiconductor crystal, a cross-section for making a chip includes a p-type protective region which connects the front surface and the rear surface of the $n^-$ drift layer, and a collector electrode which contacts the rear surface of the $n^-$ drift layer includes a Schottky metal film (for example, see JP 2009-123914 A).

As another reverse blocking semiconductor device according to the related art, a device has been proposed which includes a silicon substrate, a buffer layer formed on the silicon substrate, a gallium nitride semiconductor layer formed on the buffer layer, a trench groove which is formed with a depth reaching the gallium nitride semiconductor layer through the silicon substrate and the buffer layer from the rear surface of the silicon substrate, and a metal film formed in the trench groove. In the device, the metal film and the gallium nitride semiconductor layer form a Schottky contact (for example, see JP 2010-258327 A).

However, in the technique disclosed in JP 2009-123914 A, it is difficult to form a semiconductor region of a conduction type different from that of the semiconductor substrate with desired width and depth in the cross-section (hereinafter, referred to as a side surface) of the semiconductor substrate which is cut in a chip shape using, for example, ion implantation and annealing. Therefore, it is necessary to develop a semiconductor device with a structure capable of obtaining a reverse breakdown voltage with ease. In addition, in the technique disclosed in JP 2009-123914 A, there is a concern that a reverse leakage current will increase in the outer circumferential portions of the front and rear surfaces of the semiconductor substrate when a reverse voltage is applied to the drain electrode. When the reverse leakage current is generated, the reverse breakdown voltage is reduced.

The present invention is directed to overcoming or at least reducing the effects of one or more of the problems set forth above.

SUMMARY OF THE INVENTION

The present invention provides a semiconductor device with a high reverse breakdown voltage in order to solve the above-mentioned problems of the related art. In addition, the present invention provides a semiconductor device capable of reducing a leakage current in order to solve the above-mentioned problems of the related art.

In order to address the above-mentioned problems, a semiconductor device according to an aspect of the invention includes a semiconductor substrate that is a first conduction type and is made of a semiconductor material with a wider band gap than silicon, a control electrode that is provided on a first main surface of the semiconductor substrate, an output electrode that is provided on a second main surface and a side surface of the semiconductor substrate and forms a Schottky contact with the semiconductor substrate, and a layer that is provided at least at an outer circumferential edge of the semiconductor substrate and reduces a leakage current generated from at least the outer circumferential edge.

In the semiconductor device according to the above-mentioned aspect of the invention, the layer that reduces the leakage current may be a first semiconductor region that is a second conduction type, is provided in a surface layer of the first main surface of the semiconductor substrate, and comes into contact with the output electrode.

In the semiconductor device according to the above-mentioned aspect of the invention, the first semiconductor region may form an ohmic contact with the output electrode.

In the semiconductor device according to the above-mentioned aspect of the invention, the layer that reduces the leakage current may be a second semiconductor region that is a second conduction type, is provided in a surface layer of the second main surface of the semiconductor substrate, and comes into contact with the output electrode.

In the semiconductor device according to the above-mentioned aspect of the invention, the layer that reduces the leakage current may be an insulating film that covers the first main surface of the semiconductor substrate.

In the semiconductor device according to the above-mentioned aspect of the invention, the layer that reduces the leakage current may be an auxiliary electrode that is electrically connected to the output electrode.

In the semiconductor device according to the above-mentioned aspect of the invention, the layer that reduces the leakage current may include an insulating film that covers the first main surface of the semiconductor substrate and an auxiliary electrode that comes into contact with the output electrode and is provided so as to extend from the output electrode to a surface of the insulating film. The auxiliary electrode may come into contact with the first semiconductor region which is exposed from the first main surface of the semiconductor substrate.

In the semiconductor device according to the above-mentioned aspect of the invention, the layer that reduces the leakage current may further include a second semiconductor region that is a second conduction type, is provided in a surface layer of the second main surface of the semiconductor substrate, and comes into contact with the output electrode.

In the semiconductor device according to the above-mentioned aspect of the invention, the output electrode may extend from the second main surface to the first main surface of the semiconductor substrate and be laid across the outer circumferential edge of the first main surface.

In the semiconductor device according to the above-mentioned aspect of the invention, the semiconductor substrate may be made of silicon carbide or gallium nitride.

According to the invention, a depletion layer extends from both the interface between an n⁻ drift region, which is the semiconductor substrate, and the output electrode provided on the rear surface of the semiconductor substrate and the interface between the n⁻ drift region and the output electrode provided on the side surface of the semiconductor substrate. Therefore, it is possible to form a reverse blocking semiconductor device with a structure capable of maintaining the reverse breakdown voltage, without forming the p-type region (p-type region 208 illustrated in FIG. 14) in the side surface of the semiconductor substrate, unlike the related art. As a result, it is possible to form a semiconductor device with a reverse breakdown voltage more easily than the semiconductor device according to the related art.

The layer for reducing the leakage current covers the n⁻ drift region which is exposed from the front surface of the semiconductor substrate is provided in the outer circumferential portion of the semiconductor substrate. Therefore, when the reverse voltage is applied to the drain electrode, it is possible to reduce the reverse leakage current.

Since the semiconductor substrate made of a semiconductor material (hereinafter, referred to as a wide band gap semiconductor material) with a wider band gap than silicon is used, it is possible to improve the reverse breakdown voltage which is maintained by the Schottky contact between the n⁻ drift region and the output electrode, as compared to when the semiconductor substrate made of silicon is used.

According to the semiconductor device of the invention, it is possible to improve the reverse breakdown voltage. In addition, it is possible to reduce the leakage current.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Figure 1:
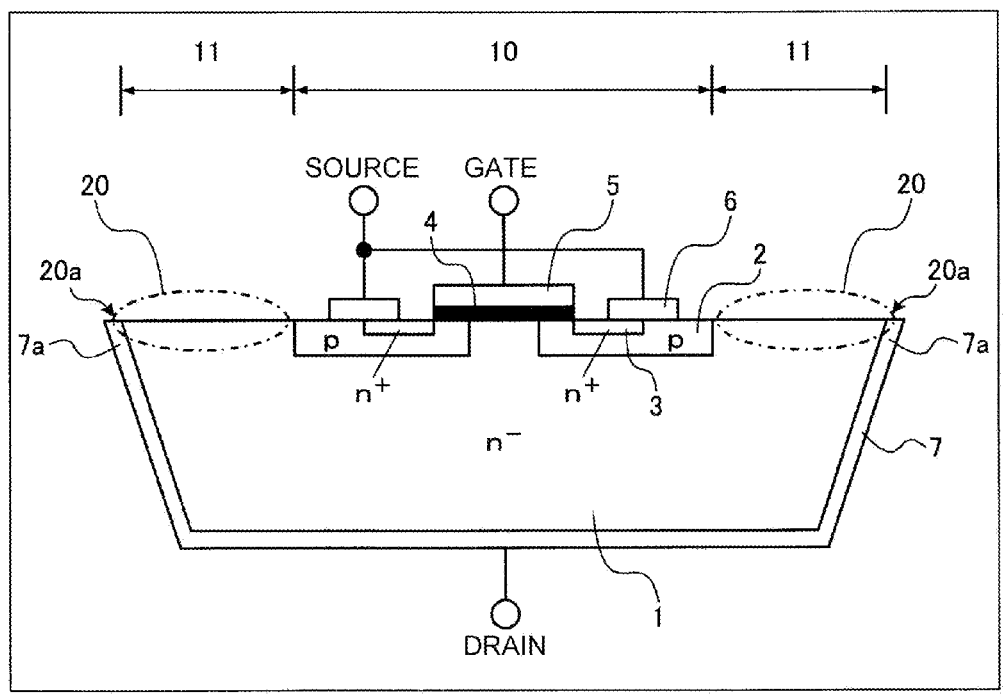
FIG. 1 is a cross-sectional view illustrating a semiconductor device according to an embodiment.

Hereinafter, a semiconductor device according to an exemplary embodiment of the invention will be described in detail with reference to the accompanying drawings. In the specification and the accompanying drawings, in the layers or regions having "n" or "p" appended thereto, an electron or a hole means a major carrier. In addition, symbols "+" and "−" added to n or p mean that impurity concentration is higher and lower than that of the layers without the symbols. In the description of the following embodiment and the accompanying drawings, the same components are denoted by the same reference numerals and the description thereof will not be repeated.

Embodiment

FIG. 1 is a cross-sectional view illustrating a semiconductor device according to an embodiment. The semiconductor device illustrated in FIG. 1 includes active region 10 in which a current flows when the semiconductor device is turned on and breakdown voltage structure portion 11 which surrounds active region 10. Breakdown voltage structure portion 11 is provided in an outer circumferential portion of an n-type (first conduction type) semiconductor substrate which will be n⁻ drift region 1. Breakdown voltage structure portion 11 is arranged on the left and right sides of active region 10 in the cross-sectional view illustrated in FIG. 1. The semiconductor substrate is made of a semiconductor material (a so-called "wide band gap semiconductor material") with a wider band gap than silicon.

Specifically, it is preferable that the semiconductor substrate be made of, for example, silicon carbide (SiC) or gallium nitride (GaN). When the semiconductor substrate made of the wide band gap semiconductor material is used, it is possible to improve a reverse breakdown voltage which is maintained by a Schottky contact, which will be described below, as compared to when a semiconductor substrate made of silicon is used. In addition, when the semiconductor substrate made of the wide band gap semiconductor material is used, it is possible to manufacture a semiconductor device with low loss and high efficiency, as compared to when the semiconductor substrate made of silicon is used.

In active region 10, p well region 2 is selectively provided in a surface layer of the front surface (first main surface) of the semiconductor substrate. N⁺ source region 3 is selectively provided in a surface layer of p well region 2. Gate electrode 5 is provided on the surface of p well region 2 which is exposed from the front surface of the semiconductor substrate between n⁻ drift region 1 and n⁺ source region 3, with gate oxide film 4 interposed therebetween.

Source electrode 6 comes into contact with p well region 2 and n⁺ source region 3. In addition, source electrode 6 is insulated from gate electrode (control electrode) 5 by an interlayer insulating film (not illustrated). As such, in active region 10, a MOS gate structure including, for example, p well region 2, n⁺ source region 3, gate electrode 5, and source electrode 6 is provided on the front surface of the semiconductor substrate.

Drain electrode (output electrode) 7 which comes into contact with n⁻ drift region 1 is provided on the cut surface (hereinafter, referred to as a side surface) of the semiconductor substrate which is cut in a chip shape from the rear surface (second main surface) of the semiconductor substrate. Drain electrode 7 is provided so as to extend from the active region 10 to breakdown voltage structure portion 11 and is also provided on the entire rear and side surfaces of the semiconductor substrate.

Drain electrode 7 is provided so as to form the Schottky contact with n⁻ drift region 1, which is the semiconductor substrate, and the Schottky contact between drain electrode 7 and n⁻ drift region 1 is formed on the entire rear and side surfaces of the semiconductor substrate. In this way, when a reverse voltage is applied to drain electrode 7, a depletion layer extends from the interface between n⁻ drift region 1 and drain electrode 7 on the rear and side surfaces of the semiconductor substrate. Therefore, it is possible to maintain the reverse breakdown voltage of the semiconductor device.

For example, the side surface of drain electrode 7 may be inclined such that the width of the semiconductor substrate is gradually increased from the rear surface (drain) to the front surface (source) (tapered shape). In addition, for example, the side surface of drain electrode 7 may be inclined such that the width of the semiconductor substrate is gradually increased from the front surface (source) to the rear surface (drain) (tapered shape), or the side surface may be perpendicular to the front surface of the semiconductor substrate.

As illustrated in FIG. 1, as breakdown voltage structure portion 11, a layer (hereinafter, referred to as a leakage current reducing layer) 20 which reduces a leakage current from the outer circumferential edge of the semiconductor substrate is provided at least at the outer circumferential edge of the semiconductor substrate. As illustrated in the cross-sectional view of FIG. 1, leakage current reducing layer 20 is provided at least between the left and right outer circumferential edges of breakdown voltage structure portion 11 and active region 10. A plurality of p-type guard rings or field limiting rings may be provided on the surface of breakdown voltage structure portion 11. The p-type guard rings or field limiting rings make it possible to reduce the width of breakdown voltage structure portion 11.

When leakage current reducing layer 20 is provided between the outer circumferential edge of breakdown voltage structure portion 11 and active region 10, n⁻ drift region 1 is not exposed from the front surface of the semiconductor substrate in breakdown voltage structure portion 11. Therefore, when a negative voltage (reverse voltage) based on source potential is applied to drain electrode 7, no carrier occurs in n⁻ drift region 1 of breakdown voltage structure portion 11 on the front surface side of the semiconductor substrate. In this way, it is possible to reduce the leakage current (hereinafter, referred to as a reverse leakage current) when the reverse voltage is applied.

In addition, outer circumferential edge 20a of leakage current reducing layer 20 is provided so as to come into contact with upper end 7a of drain electrode 7. When outer circumferential edge 20a of leakage current reducing layer 20 is provided so as to come into contact with upper end 7a of drain electrode 7, a gap from which n⁻ drift region 1 is exposed is not formed between outer circumferential edge 20a of leakage current reducing layer 20 and upper end 7a of drain electrode 7.

In this way, when the reverse voltage is applied to drain electrode 7, no carrier occurs in n⁻ drift region 1 in the vicinity of the outer circumferential edge of the semiconductor substrate. Therefore, it is possible to reduce a leakage current (hereinafter, referred to as a reverse leakage current) when the reverse voltage is applied. For example, leakage current reducing layer 20 may be provided so as to cover the front surface of the semiconductor substrate, or it may be provided in the semiconductor substrate. Leakage current reducing layer 20 surrounds active region 10, which is not illustrated in FIG. 1.

Figure 2:
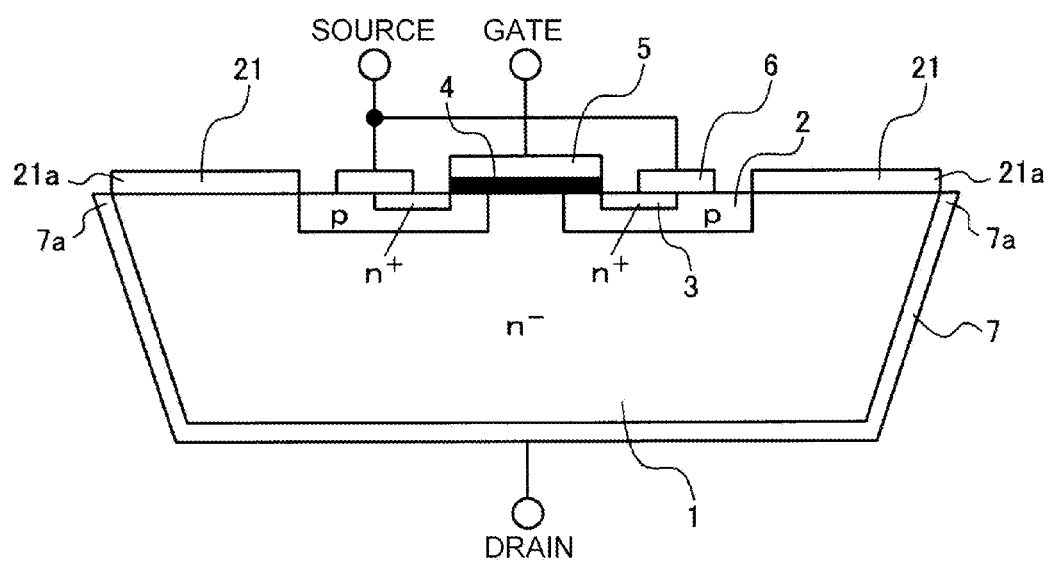
FIG. 2 is a cross-sectional view illustrating another example of the semiconductor device according to the embodiment.
Figure 3:
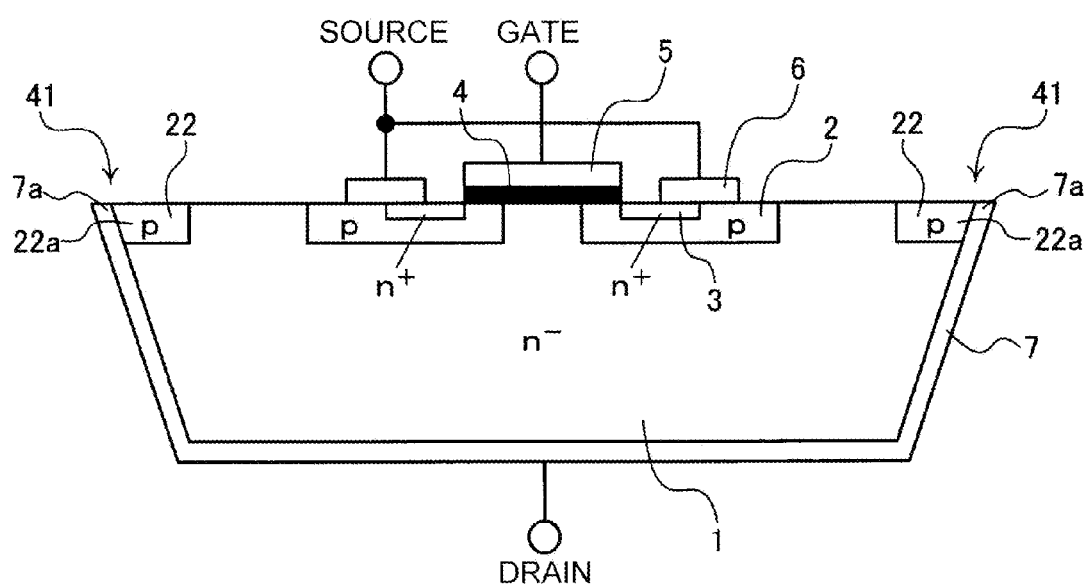
FIG. 3 is a cross-sectional view illustrating another example of the semiconductor device according to the embodiment.
Figure 4:
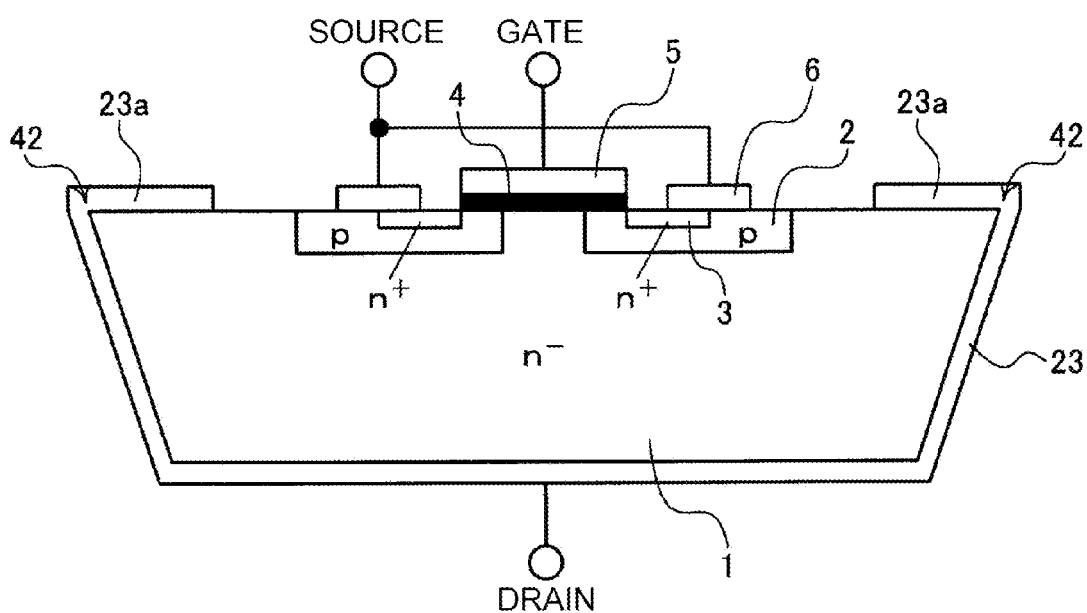
FIG. 4 is a cross-sectional view illustrating another example of the semiconductor device according to the embodiment.

Next, various examples of the structure of the leakage current reducing layer 20 described with reference to FIG. 1 will be described with reference to FIGS. 2 to 4. FIGS. 2 to 4 are cross-sectional views illustrating other examples of the semiconductor device according to the embodiment. FIGS. 2 and 4 illustrate examples in which leakage current reducing layer 20 is provided on the front surface of the semiconductor substrate. FIG. 3 illustrates an example in which leakage current reducing layer 20 is provided in a surface layer of the front surface of the semiconductor substrate. Hereinafter, leakage current reducing layer 20 of the semiconductor device illustrated in FIGS. 2 to 4 is an example of leakage current reducing layer 20 illustrated in FIG. 1 (in semiconductor devices illustrated in FIGS. 5 to 9, similarly, leakage current reducing layers 20 of the semiconductor devices are examples of leakage current reducing layer 20 illustrated in FIG. 1).

In the semiconductor device illustrated in FIG. 2, leakage current reducing layer 20 is insulating film 21 which covers n⁻ drift region 1 exposed from at least the outer circumferential portion of the front surface of the semiconductor substrate. The outer circumferential portion is a portion outside active region 10 and indicates breakdown voltage structure portion 11. In the structural example illustrated in FIG. 2, there is no gap from which n⁻ drift region 1 is exposed between outer circumferential edge 21a of insulating film 21 and upper end 7a of drain electrode 7.

FIG. 2 illustrates the semiconductor device in which insulating film 21 is provided as leakage current reducing layer 20. In the semiconductor device illustrated in FIG. 2, the arrangement of n⁻ drift region 1, p well region 2, n⁺ source region 3, gate oxide film 4, gate electrode 5, source electrode 6, and drain electrode 7 which are different components from those in the semiconductor device illustrated in FIG. 1 is the same as that in the semiconductor device illustrated in FIG. 1.

As such, since insulating film 21 is provided as leakage current reducing layer 20 in breakdown voltage structure portion 11, it is possible to reduce n⁻ drift region 1 exposed from the front surface of the semiconductor substrate. Therefore, when the reverse voltage is applied to drain electrode 7, the generation of carriers in the outer circumferential portion of the semiconductor substrate is prevented and it is possible to prevent an increase in the reverse leakage current.

In the semiconductor device illustrated in FIG. 3, leakage current reducing layer 20 is first p-type region (a first semiconductor region of a second conduction type) 22 which is provided in a surface layer of the outer circumferential portion of the front surface of the semiconductor substrate and comes into contact with drain electrode 7 provided on the side surface of the semiconductor substrate. First p-type region 22 is provided so as to be exposed from the outer circumferential edge of the front surface of the semiconductor substrate. In the structural example illustrated in FIG. 3, there is no gap from which n⁻ drift region 1 is exposed between outer circumferential edge 22a of first p-type region 22 and upper end 7a of drain electrode 7.

Since first p-type region 22 is provided in the outer circumferential portion of the semiconductor substrate, first p-type region 22 protrudes in a direction opposite to the direction in which the depletion layer extends from the active region to the breakdown voltage structure portion during forward bias. Therefore, first p-type region 22 prevents the extension of the depletion layer and functions as a channel stopper. During reverse bias, first p-type region 22 protrudes in the forward direction in which the depletion layer extends from the drain electrode to the active region. Therefore, the depletion layer extends to reduce the intensity of the electric field. It is preferable that the junction between first p-type region 22 and drain electrode 7 provided on the side surface of the semiconductor substrate be an ohmic contact in order to stabilize the potential of drain electrode 7.

In the semiconductor device illustrated in FIG. 3, first p-type region 22 is provided as leakage current reducing layer 20, and the arrangement of n⁻ drift region 1, p well region 2, n⁺ source region 3, gate oxide film 4, gate electrode 5, source electrode 6, and drain electrode 7 which are different components from those in the semiconductor device illustrated in FIG. 1 is the same as that in the semiconductor device illustrated in FIG. 1. In addition, an insulating film (not illustrated) may be provided on a portion of the semiconductor substrate between first p-type region 22 and p well region 2.

As such, when first p-type region 22 is provided, the depletion layer extends from the pn junction portion between first p-type region 22 and n⁻ drift region 1. Therefore, when the reverse voltage is applied to drain electrode 7, it is possible to prevent the generation of a reverse leakage current from corner portion 41 of the front surface of the semiconductor substrate in which the reverse leakage current is likely to be generated. When first p-type region 22 is provided in the front surface of the semiconductor substrate, corner portion 41 of the front surface of the semiconductor substrate is the interface between first p-type region 22 and drain electrode 7 at the outer circumferential edge of the front surface of the semiconductor substrate.

In the semiconductor device illustrated in FIG. 4, drain electrode 23 is provided from the side surface of the semiconductor substrate to the front surface of the semiconductor substrate and is laid across the outer circumferential edge of the front surface. Drain electrode 23 is provided on the entire rear and side surfaces of the semiconductor substrate and a portion of the front surface of the semiconductor substrate. The width of bent portion 23a of drain electrode 23 which is provided on the front surface of the semiconductor substrate may vary depending on the design conditions of the semiconductor device and may be a sufficient value to cover at least the corner portion 41 of the front surface of the semiconductor substrate. In this case, a portion (bent portion 23a) of drain electrode 23 which covers the outer circumferential portion of the front surface of the semiconductor substrate is leakage current reducing layer 20.

In the semiconductor device illustrated in FIG. 4, bent portion 23a of drain electrode 23 is provided as leakage current reducing layer 20 and the arrangement of n⁻ drift region 1, p well region 2, n⁺ source region 3, gate oxide film 4, gate electrode 5, source electrode 6, and drain electrode 23 which are different components from those in the semiconductor device illustrated in FIG. 1 is the same as that in the semiconductor device illustrated in FIG. 1.

In the semiconductor device illustrated in FIG. 4, it is preferable that bent portion 23a of drain electrode 23 be provided so as to cover a portion of the outer circumferential portion including the outer circumferential edge of the front surface of the semiconductor substrate. In addition, an insulating film (not illustrated) may be provided on a portion of the semiconductor substrate between p well region 2 and bent portion 23a of drain electrode 23.

In the outer circumferential portion of the semiconductor substrate, as the width of a portion of n⁻ drift region 1 which is arranged from the end of bent portion 23a of drain electrode 23 close to active region 10 to the end of p well region 2 close to breakdown voltage structure portion 11 and is exposed from the front surface of the semiconductor substrate is reduced, the intensity of the electric field in the vicinity of the end of active region 10 close to breakdown voltage structure portion 11 increases. Therefore, the width of bent portion 23a of drain electrode 23 may vary depending on the design conditions of the semiconductor device.

Bent portion 23a of drain electrode 23 causes the depletion layer to extend from the interface between n⁻ drift region 1 and bent portion 23a of drain electrode 23 on the front surface of the semiconductor substrate when the reverse voltage is applied to drain electrode 23. Therefore, when the reverse voltage is applied to drain electrode 23, it is possible to prevent the generation of a reverse leakage current from corner portion 42 of the front surface of the semiconductor substrate in which the reverse leakage current is likely to be generated. When n⁻ drift region 1 is exposed from the entire outer circumferential portion of the front surface of the semiconductor substrate, corner portion 42 of the front surface of the semiconductor substrate is the interface between n⁻ drift region 1 and drain electrode 7 at the outer circumferential edge of the front surface of the semiconductor substrate.

Leakage current reducing layer 20 may be various combinations of insulating film 21, first p-type region 22, and bent portion 23a of drain electrode 23 which is provided from the side surface of the semiconductor substrate to the outer circumferential portion of the front surface. FIGS. 5 to 9 are cross-sectional views illustrating other examples of the semiconductor device according to the embodiment.

Figure 5:
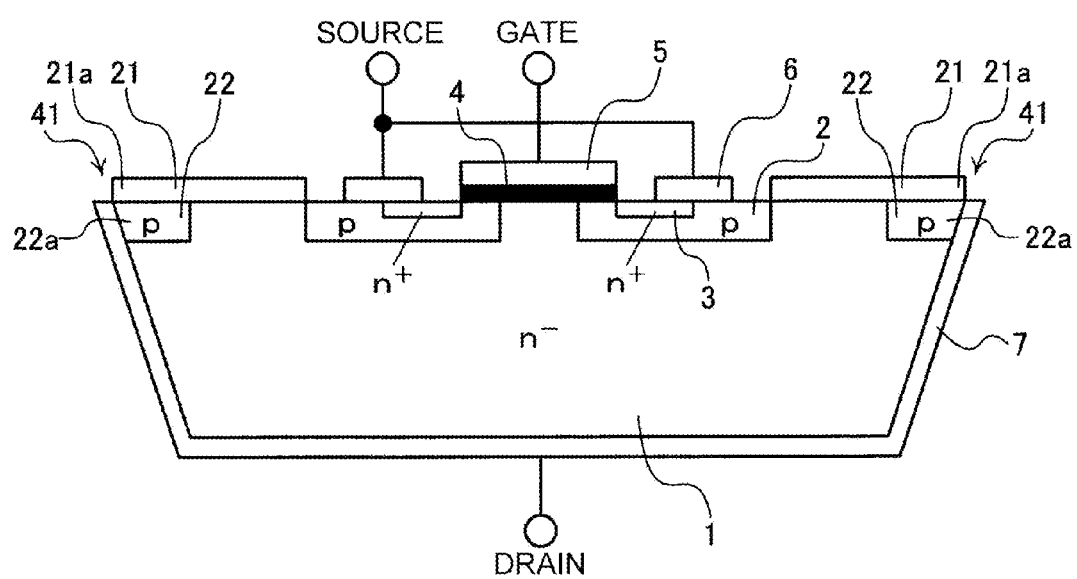
FIG. 5 is a cross-sectional view illustrating another example of the semiconductor device according to the embodiment.

In the semiconductor device illustrated in FIG. 5, leakage current reducing layer 20 includes insulating film 21 which covers a portion of n⁻ drift region 1 exposed from at least the outer circumferential portion of the front surface of the semiconductor substrate and first p-type region 22 which is exposed from the outer circumferential edge of the front surface of the semiconductor substrate. In the semiconductor device illustrated in FIG. 5, in the outer circumferential portion of the semiconductor substrate, n⁻ drift region 1 and first p-type region 22 are exposed from the front surface of the semiconductor substrate.

Therefore, insulating film 21 may cover n⁻ drift region 1 and first p-type region 22 which are exposed from the front surface of the semiconductor substrate. In the structural example illustrated in FIG. 5, outer circumferential edge 22a of first p-type region 22 may be provided such that there is no gap from which n⁻ drift region 1 is exposed between outer circumferential edge 22a of first p-type region 22 and upper end 7a of drain electrode 7. Outer circumferential edge 21a of insulating film 21 may be provided such that there is no gap from which first p-type region 22 is exposed between outer circumferential edge 21a of insulating film 21 and upper end 7a of drain electrode 7.

In the semiconductor device illustrated in FIG. 5, insulating film 21 and first p-type region 22 are used as leakage current reducing layer 20 and the arrangement of n⁻ drift region 1, p well region 2, n⁺ source region 3, gate oxide film 4, gate electrode 5, source electrode 6, and drain electrode 7 which are different components from those in the semiconductor device illustrated in FIG. 1 is the same as that in the semiconductor device illustrated in FIG. 1.

In the semiconductor device illustrated in FIG. 5, since insulating film 21 and first p-type region 22 are provided, insulating film 21 prevents the generation of carriers in the outer circumferential portion of the semiconductor substrate and it is possible to prevent an increase in the reverse leakage current. In addition, first p-type region 22 makes it possible to prevent the generation of the reverse leakage current from corner portion 41 of the front surface of the semiconductor substrate in which the reverse leakage current is likely to be generated, when the reverse voltage is applied to drain electrode 7.

Figure 6:
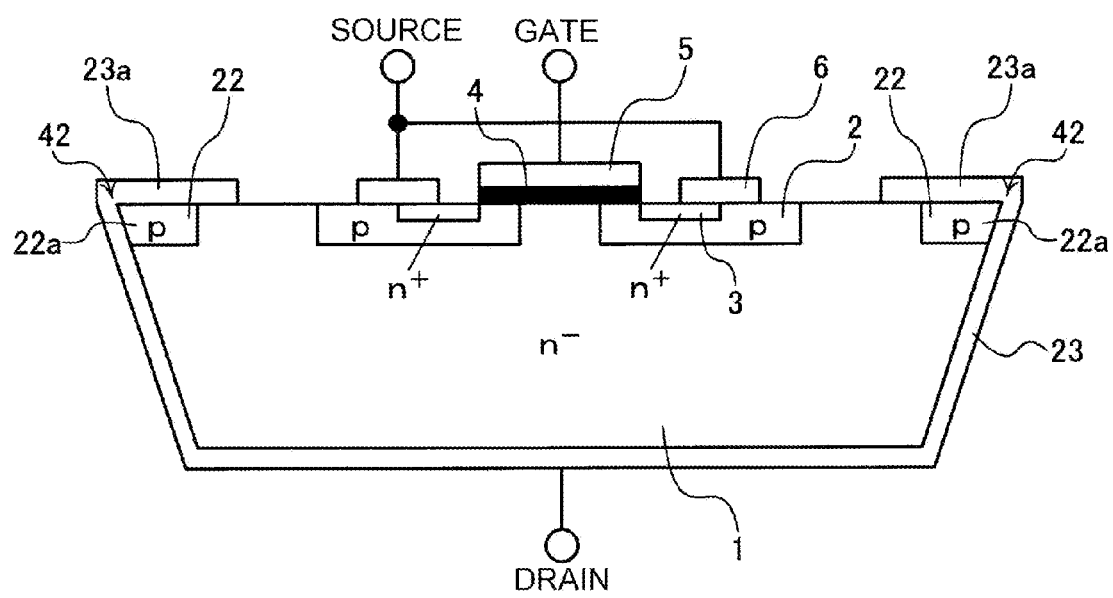
FIG. 6 is a cross-sectional view illustrating another example of the semiconductor device according to the embodiment.

In the semiconductor device illustrated in FIG. 6, leakage current reducing layer 20 includes first p-type region 22 which is exposed from the outer circumferential edge of the front surface of the semiconductor substrate and bent portion 23a of drain electrode 23 which is provided from the side surface of the semiconductor substrate to the outer circumferential portion of the front surface. In the semiconductor device illustrated in FIG. 6, in outer circumferential portion of the semiconductor substrate, n⁻ drift region 1 and first p-type region 22 are exposed from the front surface of the semiconductor substrate.

Therefore, a portion (bent portion 23a) of drain electrode 23 which is provided on the front surface of the semiconductor substrate covers first p-type region 22 exposed from the front surface of the semiconductor substrate. In the structural example illustrated in FIG. 6, outer circumferential edge 22a of first p-type region 22 is provided such that n⁻ drift region 1 comes into contact with bent portion 23a of drain electrode 23 without a gap therebetween.

In the semiconductor device illustrated in FIG. 6, first p-type region 22 and bent portion 23a of drain electrode 23 are provided as leakage current reducing layer 20 and the arrangement of n⁻ drift region 1, p well region 2, n⁺ source region 3, gate oxide film 4, gate electrode 5, source electrode 6, and drain electrode 23 which are different components from those in the semiconductor device illustrated in FIG. 1 is the same as that in the semiconductor device illustrated in FIG. 1.

As such, when first p-type region 22 and bent portion 23a of drain electrode 23 are provided, first p-type region 22 makes it possible to prevent the generation of a reverse leakage current from corner portion 41 of the front surface of the semiconductor substrate in which the reverse leakage current is likely to be generated. In addition, bent portion 23a of drain electrode 23 makes it possible to prevent the generation of the reverse leakage current from corner portion 42 of the front surface of the semiconductor substrate in which the reverse leakage current is likely to be generated, when the reverse voltage is applied to drain electrode 23.

Figure 7:
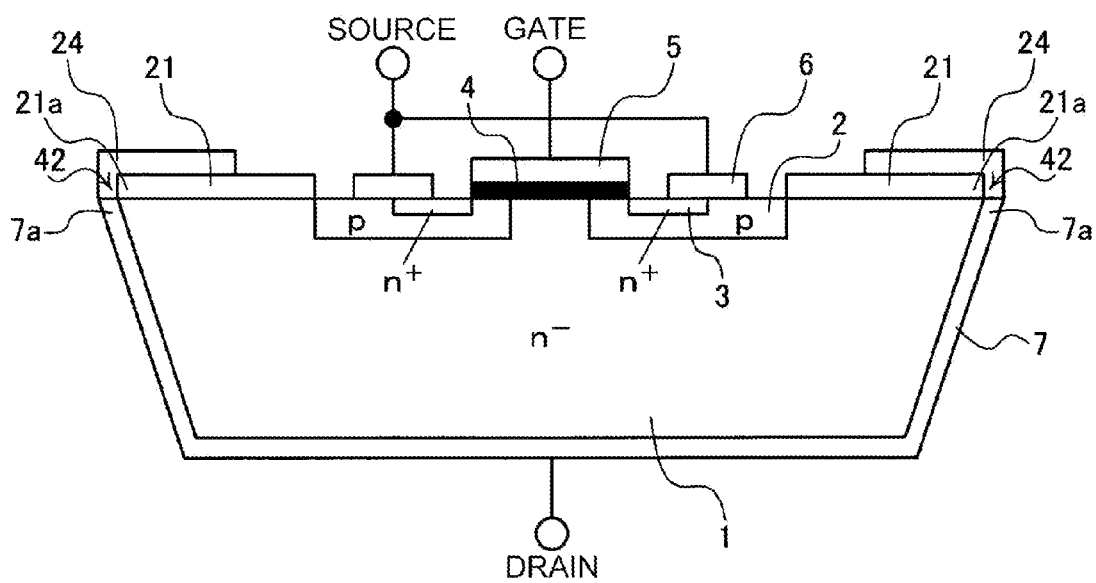
FIG. 7 is a cross-sectional view illustrating another example of the semiconductor device according to the embodiment.

In the semiconductor device illustrated in FIG. 7, leakage current reducing layer 20 includes insulating film 21 which covers n⁻ drift region 1 exposed from at least the outer circumferential portion of the front surface of the semiconductor substrate and auxiliary electrode 24 which comes into contact with drain electrode 7. In the semiconductor device illustrated in FIG. 7, insulating film 21 covers at least corner portion 42 of the front surface of the semiconductor substrate. Auxiliary electrode 24 comes into contact with drain electrode 7, extends from drain electrode 7 to the surface of insulating film 21, and covers a portion of insulating film 21. Auxiliary electrode 24 may not form the Schottky contact since it does not come into contact with n⁻ drift region 1.

In the semiconductor device illustrated in FIG. 7, auxiliary electrode 24 functions as a field plate and reduces the electric field intensity of the front surface of the semiconductor substrate when the reverse voltage is applied to drain electrode 7. Therefore, it is possible to easily maintain the reverse breakdown voltage of the semiconductor device. In the structural example illustrated in FIG. 7, outer circumferential edge 21a of insulating film 21 is provided such that there is no gap from which n⁻ drift region 1 is exposed between outer circumferential edge 21a of insulating film 21 and upper end 7a of drain electrode 7. Auxiliary electrode 24 is bonded to upper end 7a of drain electrode 7 such that there is no gap between auxiliary electrode 24 and upper end 7a of drain electrode 7.

In the semiconductor device illustrated in FIG. 7, insulating film 21 and auxiliary electrode 24 are provided as leakage current reducing layer 20 and the arrangement of n⁻ drift region 1, p well region 2, n⁺ source region 3, gate oxide film 4, gate electrode 5, source electrode 6, and drain electrode 7 which are different components from those in the semiconductor device illustrated in FIG. 1 is the same as that in the semiconductor device illustrated in FIG. 1.

As such, when insulating film 21 and auxiliary electrode 24 are provided, insulating film 21 prevents the generations of carriers in the outer circumferential portion of the semiconductor substrate and it is possible to prevent an increase in the reverse leakage current. In addition, when the reverse voltage is applied to drain electrode 7, the electric field intensity of the front surface of the semiconductor substrate is reduced by auxiliary electrode 24. Therefore, it is possible to easily maintain the reverse breakdown voltage of the semiconductor device.

Figure 8:
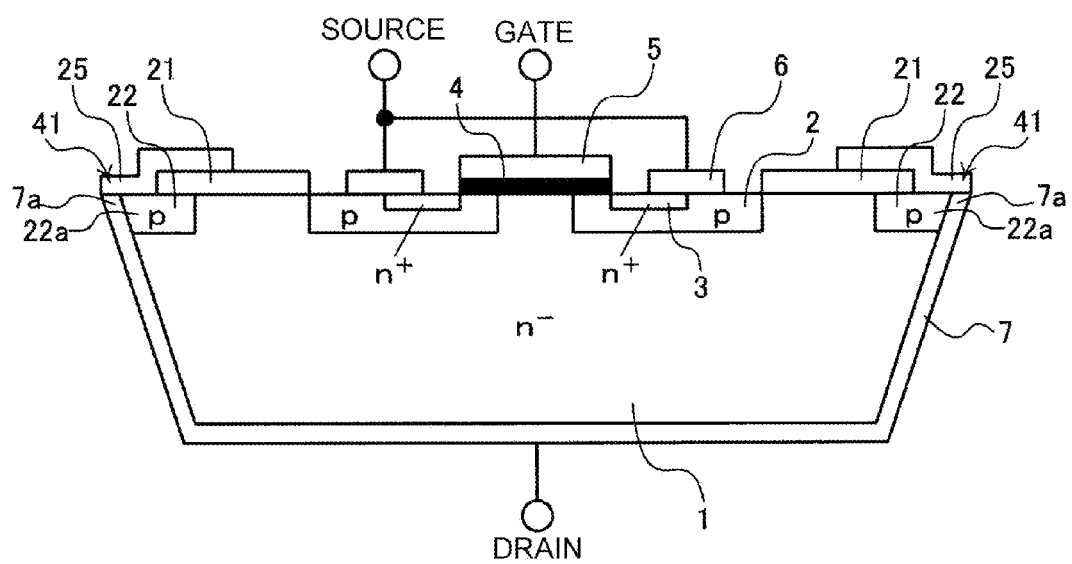
FIG. 8 is a cross-sectional view illustrating another example of the semiconductor device according to the embodiment.

In the semiconductor device illustrated in FIG. 8, leakage current reducing layer 20 includes insulating film 21 covering a portion of n⁻ drift region 1 which is exposed from at least the outer circumferential portion of the front surface of the semiconductor substrate, first p-type region 22 which is exposed from the outer circumferential edge of the front surface of the semiconductor substrate, and auxiliary electrode 25 which is electrically connected to drain electrode 7. In the semiconductor device illustrated in FIG. 8, in the outer circumferential portion of the semiconductor substrate, n⁻ drift region 1 and first p-type region 22 are exposed from the front surface of the semiconductor substrate.

In the semiconductor device illustrated in FIG. 8, insulating film 21 may cover a portion of first p-type region 22. Auxiliary electrode 25 is provided from the outer circumferential edge of the front surface to the surface of insulating film 21. A portion of first p-type region 22 which is not covered by insulating film 21 is covered by auxiliary electrode 25.

The semiconductor device illustrated in FIG. 8 differs from the semiconductor device illustrated in FIG. 7 in that it includes first p-type region 22 and auxiliary electrode 25 comes into contact with first p-type region 22 which is exposed from the front surface of the semiconductor substrate. Auxiliary electrode 25 comes into contact with first p-type region 22, is provided so as to extend from first p-type region 22 to the surface of insulating film 21, and has, for example, a step shape in a cross-sectional view. Auxiliary electrode 25 is electrically connected to drain electrode 7 which is provided on the side surface of the semiconductor substrate through first p-type region 22.

Therefore, auxiliary electrode 25 may come into direct contact with drain electrode 7 provided on the side surface of the semiconductor substrate or it may not come into contact with drain electrode 7. In the structural example illustrated in FIG. 8, the outer circumferential edge of first p-type region 22 is provided such that there is no gap from which n⁻ drift region 1 is exposed between the outer circumferential edge of first p-type region 22 and upper end 7a of drain electrode 7.

In the semiconductor device illustrated in FIG. 8, insulating film 21, first p-type region 22, and auxiliary electrode 25 are provided as leakage current reducing layer 20 and the arrangement of n⁻ drift region 1, p well region 2, n⁺ source region 3, gate oxide film 4, gate electrode 5, source electrode 6, and drain electrode 7 which are different components from those in the semiconductor device illustrated in FIG. 1 is the same as that in the semiconductor device illustrated in FIG. 1.

As such, in the semiconductor device illustrated in FIG. 8, when insulating film 21, first p-type region 22, and auxiliary electrode 25 are provided, the generation of carriers in the outer circumferential portion of the semiconductor substrate is prevented by insulating film 21 and it is possible to prevent an increase in the reverse leakage current. In addition, in the semiconductor device illustrated in FIG. 8, first p-type region 22 makes it possible to prevent the generation of the reverse leakage current from corner portion 41 of the front surface of the semiconductor substrate in which the reverse leakage current is likely to be generated.

In the semiconductor device illustrated in FIG. 8, auxiliary electrode 25 makes it possible to reduce the electric field intensity of the front surface of the semiconductor substrate when the reverse voltage is applied to drain electrode 7. As such, according to the semiconductor device illustrated in FIG. 8, it is possible to easily maintain the reverse breakdown voltage of the semiconductor device.

Figure 9:
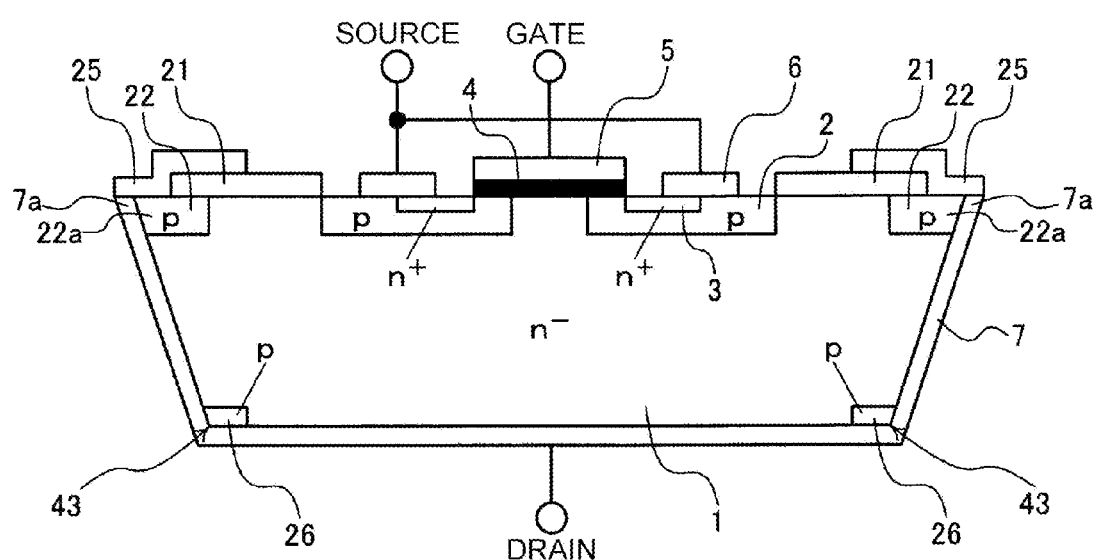
FIG. 9 is a cross-sectional view illustrating another example of the semiconductor device according to the embodiment.

The semiconductor device illustrated in FIG. 9 includes second p-type region (a second semiconductor region of a second conduction type) 26 which serves as leakage current reducing layer 20 and is provided in a surface layer of the rear surface of the semiconductor substrate so as to come into contact with drain electrode 7 provided on the side surface of the semiconductor substrate, in addition to the components of the semiconductor device illustrated in FIG. 8.

Second p-type region 26 is provided in corner portion 43 of the rear surface of the semiconductor substrate and comes into contact with drain electrode 7 provided on the side and rear surfaces of the semiconductor substrate. Corner portion 43 of the rear surface of the semiconductor substrate is the interface between n⁻ drift region 1 and drain electrode 7 at the outer circumferential edge of the rear surface of the semiconductor substrate when second p-type region 26 is not provided.

In the semiconductor device illustrated in FIG. 9, insulating film 21, first p-type region 22, auxiliary electrode 25, and second p-type region 26 are provided as leakage current reducing layer 20 and the arrangement of n⁻ drift region 1, p well region 2, n⁺ source region 3, gate oxide film 4, gate electrode 5, source electrode 6, and drain electrode 7 which are different components from those in the semiconductor device illustrated in FIG. 1 is the same as that in the semiconductor device illustrated in FIG. 1.

As such, since second p-type region 26 is provided, a depletion layer also extends from the pn junction portion between second p-type region 26 and n⁻ drift region 1. Therefore, when the reverse voltage is applied to drain electrode 7, it is possible to prevent the generation of the reverse leakage current from corner portion 43 of the rear surface of the semiconductor substrate in which the reverse leakage current is likely to be generated.

Each of the semiconductor devices illustrated in FIGS. 5 to 8 includes two or more of insulating film 21, first p-type region 22, and bent portion 23a of drain electrode 23 which are provided as leakage current reducing layer 20 in the semiconductor devices illustrated in FIGS. 2 to 4. Therefore, the semiconductor devices illustrated in FIGS. 5 to 8 can have a plurality of combinations of the effects obtained by the semiconductor devices illustrated in FIGS. 1 to 4. Specifically, in each case, it is possible to obtain the following effects.

In the case in which insulating film 21 which covers n⁻ drift region 1 exposed from at least the outer circumferential portion of the front surface of the semiconductor substrate is provided (FIGS. 5, 7, and 8), when the reverse voltage is applied to drain electrode 7, it is possible to prevent the generation of carriers in the outer circumferential portion of the semiconductor substrate and prevent an increase in the reverse leakage current.

When first p-type region 22 which is exposed from the outer circumferential edge of the front surface of the semiconductor substrate (FIGS. 5, 6, and 8), and when bent portion 23a of drain electrode 23 is provided so as to extend from the side surface of the semiconductor substrate to the outer circumferential portion of the front surface (FIG. 6), the depletion layer extends from the pn junction portion between first p-type region 22 and n⁻ drift region 1 and the interface between n⁻ drift region 1 and bent portion 23a of drain electrode 23. Therefore, when the reverse voltage is applied to drain electrode 7, it is possible to prevent the generation of the reverse leakage current from corner portion 41 of the front surface of the semiconductor substrate.

In the case in which auxiliary electrodes 24 and 25 electrically connected to drain electrode 7 are provided (FIGS. 7 and 8), when the reverse voltage is applied to drain electrode 7, auxiliary electrodes 24 and 25 can reduce the electric field intensity of the front surface of the semiconductor substrate. Therefore, it is possible to easily maintain the reverse breakdown voltage of the semiconductor device.

The semiconductor devices illustrated in FIGS. 1 to 7 may include second p-type region 26 which is provided as leakage current reducing layer 20 in corner portion 43 of the rear surface of the semiconductor substrate in the semiconductor device illustrated in FIG. 9. When second p-type region 26 is provided in corner portion 43 of the rear surface of the semiconductor substrate (FIG. 9), the depletion layer extends from the pn junction portion between second p-type region 26 and n⁻ drift region 1. Therefore, when the reverse voltage is applied to drain electrode 7, it is possible to prevent the generation of the reverse leakage current from corner portion 43 of the rear surface of the semiconductor substrate.

It is preferable that the front and rear surfaces of the semiconductor substrate which form the Schottky contact be flat and clean in order to reduce the reverse leakage current generated from the surface of the semiconductor substrate.

The side surface of the semiconductor substrate according to each of the above-mentioned structural examples may be perpendicular to the front surface of the semiconductor substrate or it may have a tapered shape. In the structural examples shown in FIGS. 1 to 9, the side surface of the semiconductor substrate is inclined such that the width of the semiconductor substrate gradually increases from the rear surface (drain) to the front surface (source). The interface of the semiconductor substrate which contacts the Schottky electrode needs to be processed into a flat and clean surface. When the side surface of the semiconductor substrate has a tapered shape, it is easy to form drain electrodes 7 and 23 on the rear and side surfaces of the semiconductor substrate using a sputtering method or a vapor deposition method, as compared to when the side surface of the semiconductor substrate is perpendicular to the front surface.

Therefore, when the side surface of the semiconductor substrate has a tapered shape, it is easy to uniformly form metal films which will be drain electrodes 7 and 23 on the entire side surface of the semiconductor substrate, as compared to when the side surface of the semiconductor substrate is perpendicular to the front surface. In addition, after the metal films which will be drain electrodes 7 and 23 are formed on the side surface of the semiconductor substrate, it is possible to uniformly anneal the metal films which will be drain electrodes 7 and 23. Therefore, it is possible to form drain electrodes 7 and 23 on the side surface of the semiconductor substrate with high controllability.

When the metal films which will be drain electrodes 7 and 23 can be uniformly formed on the side surface of the semiconductor substrate and then uniformly annealed, the side surface of the semiconductor substrate may be perpendicular to the front surface. In addition, when the Schottky contact can be formed in the side surface of the semiconductor substrate by drain electrodes 7 and 23, the side surface of the semiconductor substrate may be perpendicular to the front surface.

Figure 10:
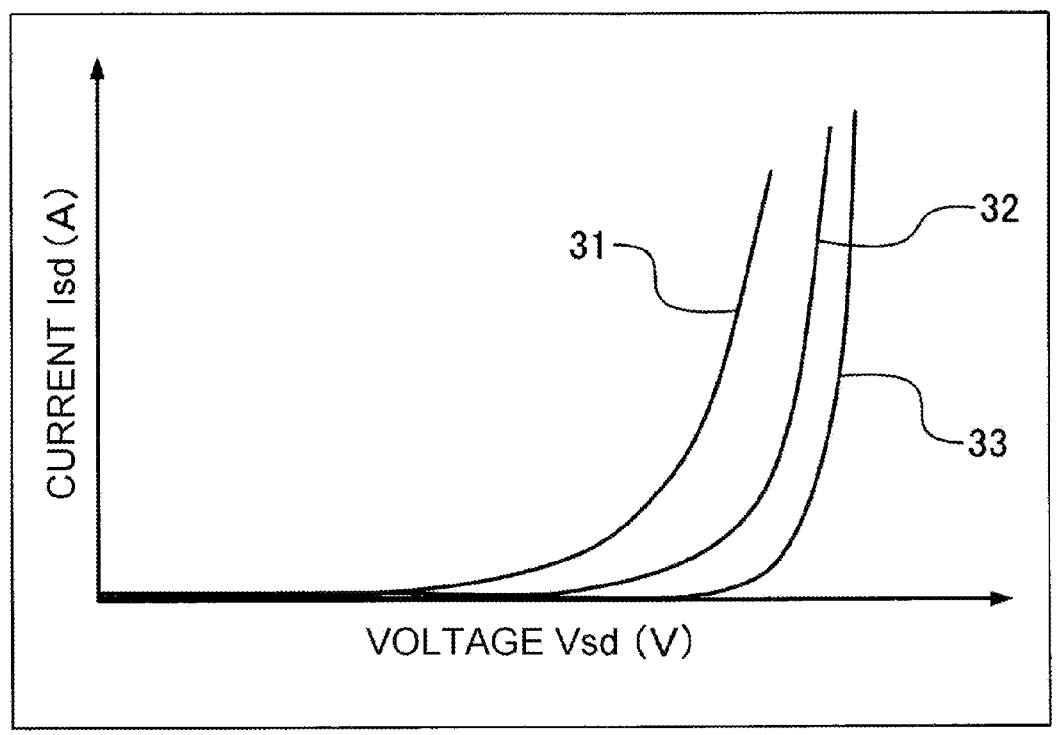
FIG. 10 is a characteristic diagram illustrating the electrical characteristics of the semiconductor device according to the embodiment.
Figure 11:
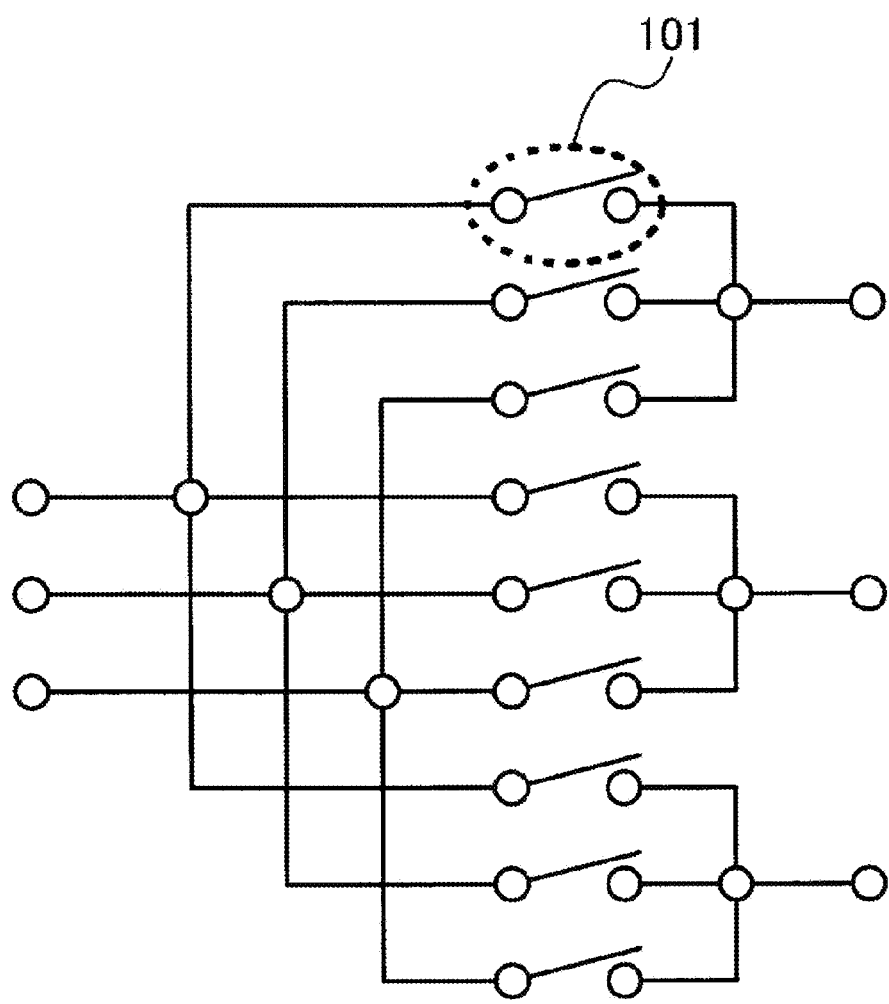
FIG. 11 is an equivalent circuit diagram illustrating a matrix converter.
Figure 12:
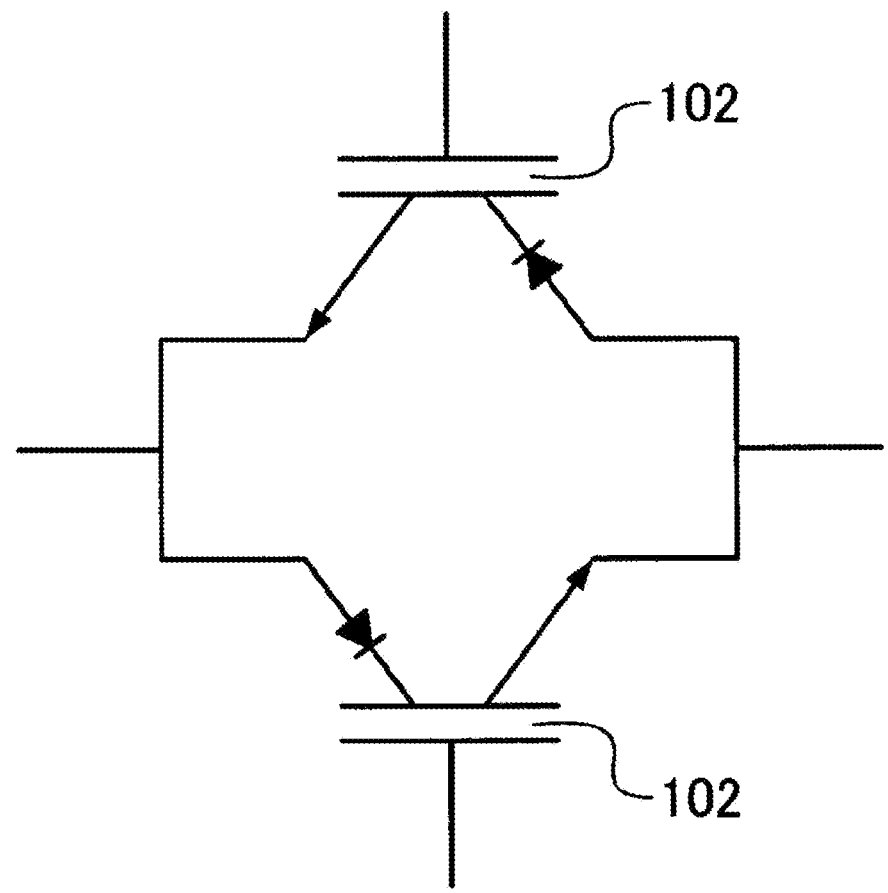
FIG. 12 is an equivalent circuit diagram illustrating a reverse blocking semiconductor device according to the related art.
Figure 13:
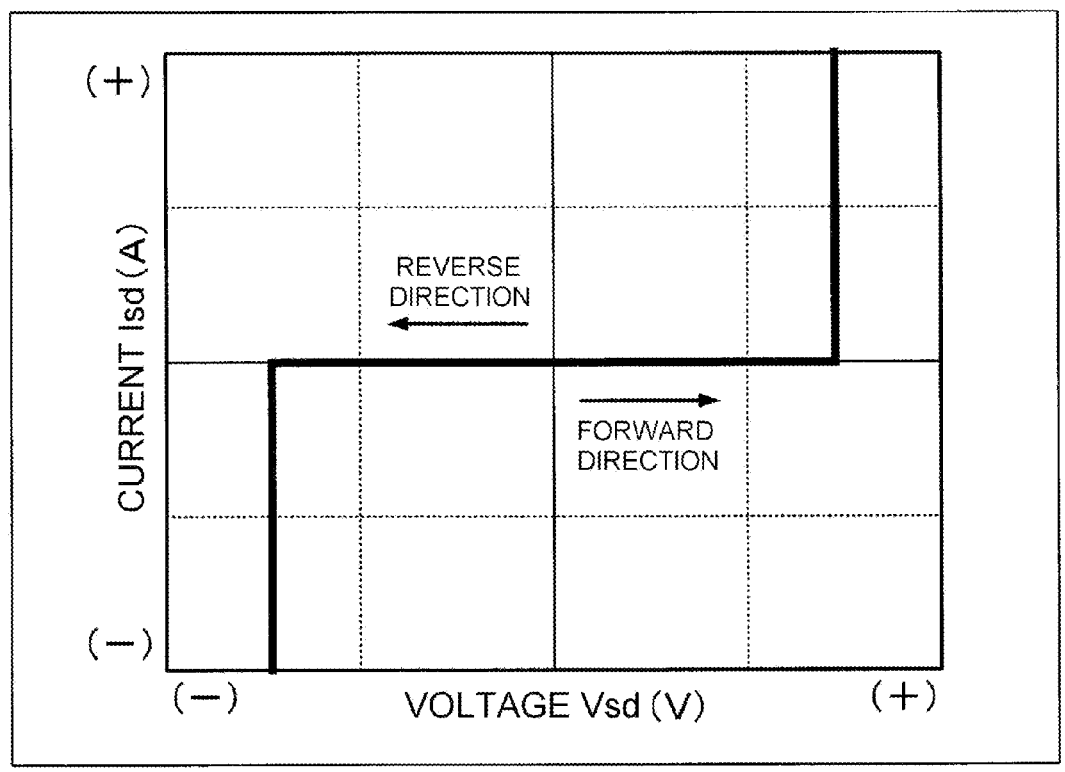
FIG. 13 is a characteristic diagram illustrating the electrical characteristics of the reverse blocking semiconductor device according to the related art.

The magnitude of the leakage current of the semiconductor device according to the embodiment was verified. FIG. 10 is a characteristic diagram illustrating the electrical characteristics of the semiconductor device according to the embodiment. FIG. 10 illustrates the waveforms of the reverse leakage current of the semiconductor devices illustrated in FIGS. 1 to 9. In FIG. 10, the horizontal axis is a voltage Vsd which is based on source potential and is applied to the drain. In FIG. 10, the vertical axis is a leakage current Isd flowing when the voltage Vsd is applied to the drain. The voltage Vsd is positive when a negative voltage is applied to the drain. The leakage current Isd flowing from the source to the drain is positive.

In FIG. 10, first curve 31 indicates the waveform of the reverse leakage current of the semiconductor device without leakage current reducing layer 20. The semiconductor device without leakage current reducing layer 20 is for verifying the effect of leakage current reducing layer 20 provided in the semiconductor device according to the embodiment. A second curve 32 indicates the waveform of the reverse leakage current of the semiconductor devices illustrated in FIGS. 1 to 8. A third curve 33 indicates the waveform of the reverse leakage current of the semiconductor device illustrated in FIG. 9.

As illustrated in FIG. 10, in the semiconductor devices (second curve 32 and third curve 33) illustrated in FIGS. 1 to 9, the reverse leakage current is less than that in the semiconductor device (first curve 31) without leakage current reducing layer 20. This proved that the generation of the reverse leakage current in the outer circumferential portion of the semiconductor substrate or corner portion 43 of the rear surface was prevented.

In the semiconductor device (third curve 33) illustrated in FIG. 9, the reverse leakage current is less than that in the semiconductor devices (second curve 32) shown in FIGS. 1 to 8. This proved that the reverse leakage current in the semiconductor device illustrated in FIG. 9 was less than that in the semiconductor devices illustrated in FIGS. 1 to 8 by a value corresponding to a reduction in the reverse leakage current in corner portion 43 of the rear surface of the semiconductor substrate.

Figure 14:
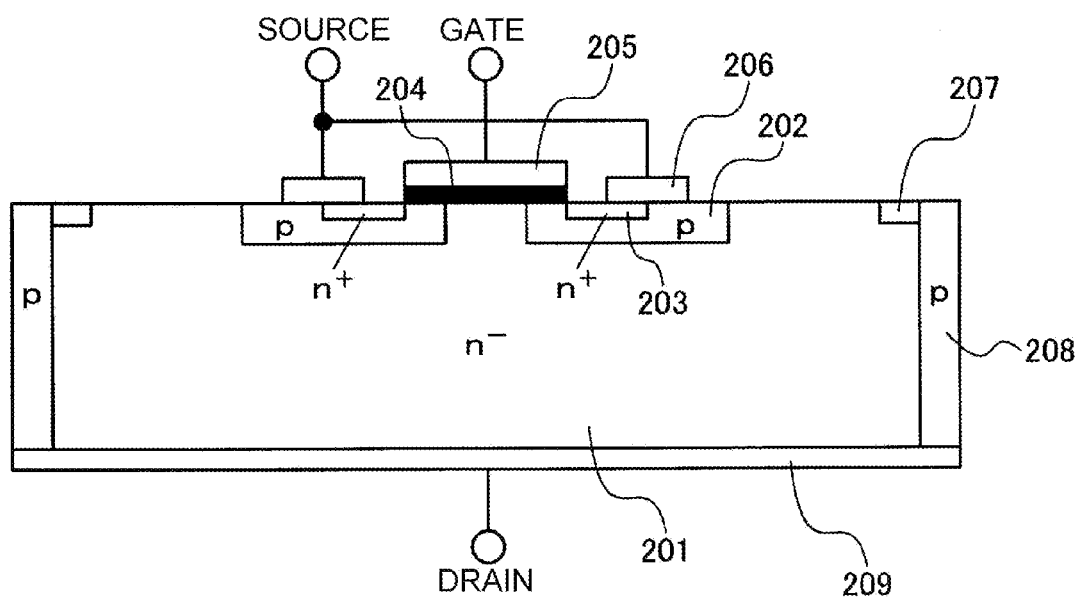
FIG. 14 is a cross-sectional view illustrating the reverse blocking semiconductor device according to the related art.

As described above, according to the embodiment, drain electrode 7 is provided from the rear surface to the side surface of the semiconductor substrate. Drain electrode 7 and n⁻ drift region 1, which is the semiconductor substrate, form the Schottky contact. In this way, the depletion layer extends from both the interface between n⁻ drift region 1 and drain electrode 7 provided on the rear surface of the semiconductor substrate and the interface between n⁻ drift region 1 and drain electrode 7 provided on the side surface of the semiconductor substrate. Therefore, it is possible to form a reverse blocking semiconductor device capable of maintaining the reverse breakdown voltage, without forming the p-type region (p-type region 208 illustrated in FIG. 14) on the side surface of the semiconductor substrate, unlike the related art.

In the semiconductor device according to the embodiment, it is not necessary to form the p-type region on the side surface of the semiconductor substrate, unlike the semiconductor device according to the related art. Therefore, for example, it is possible to easily obtain a reverse blocking semiconductor device only by forming drain electrode 7 using a sputtering method or a vapor deposition method, as compared to the semiconductor device according to the related art in which the p-type region is formed on the side surface of the semiconductor substrate by ion implantation and annealing.

According to the embodiment, it is possible to easily manufacture a reverse blocking semiconductor device, as compared to when the semiconductor device (see FIG. 14) according to the related art is manufactured. In addition, according to the embodiment, since the side surface of the semiconductor substrate has a tapered shape, it is possible to manufacture a reverse blocking semiconductor device with a structure in which it is easy to drain electrode 7.

The semiconductor device according to the embodiment includes leakage current reducing layer 20 covering n⁻ drift region 1 which is exposed from the front surface of the semiconductor substrate in the outer circumferential portion of the semiconductor substrate. Therefore, when the reverse voltage is applied to drain electrode 7, it is possible to reduce the reverse leakage current.

Since the semiconductor substrate made of a wide band gap semiconductor material is used, it is possible to improve the reverse breakdown voltage which is maintained by the Schottky contact of n⁻ drift region 1 and drain electrode 7, as compared to when the semiconductor substrate made of silicon is used. Specifically, when the semiconductor substrate made of silicon is used, the breakdown voltage maintained by the Schottky contact is about 200 V. On the other hand, when the semiconductor substrate made of wide band gap semiconductor material is used, the breakdown voltage maintained by the Schottky contact can increase to about 1200 V.

The invention is not limited to the above-described embodiment, but the insulating film, the first p-type region, and the bent portion of the drain electrode, and the second p-type region which form the leakage current reducing layer can be combined in various ways. For example, the insulating film and the bent portion of the drain electrode may be provided as the leakage current reducing layer and the bent portion of the drain electrode may cover a portion of the surface of the insulating film. In the above-described embodiment, the first conduction type is an n type and the second conduction type is a p type. However, in the invention, the first conduction type may be a p type and the second conduction type may be an n type. In this case, the same effect as described above is obtained.

As described above, the semiconductor device according to the invention is useful for a power semiconductor device which is used in, for example, a direct link conversion circuit such as a matrix converter.

Thus, a semiconductor device has been described according to the present invention. Many modifications and variations may be made to the techniques and structures described and illustrated herein without departing from the spirit and scope of the invention. Accordingly, it should be understood that the devices described herein are illustrative only and are not limiting upon the scope of the invention.

REFERENCE SIGNS LIST 1 n⁻ DRIFT REGION
2 p WELL REGION
3 n⁺ SOURCE REGION
4 GATE OXIDE FILM
5 GATE ELECTRODE
6 SOURCE ELECTRODE
7 DRAIN ELECTRODE
10 ACTIVE REGION
11 BREAKDOWN VOLTAGE STRUCTURE REGION
20 LEAKAGE CURRENT REDUCING LAYER

What is claimed is:

1. A semiconductor device comprising:
a semiconductor substrate that is a first conduction type and is made of a semiconductor material with a wider band gap than silicon;
a control electrode that is provided on a first main surface of the semiconductor substrate;
an output electrode that is provided on a second main surface and a side surface of the semiconductor substrate and forms a Schottky contact with the semiconductor substrate; and
a layer that is provided at least at an outer circumferential edge of the semiconductor substrate and reduces a leakage current generated from at least the outer circumferential edge.

2. The semiconductor device according to claim 1, wherein the layer that reduces the leakage current is a first semiconductor region that is a second conduction type, is provided in a surface layer of the first main surface of the semiconductor substrate, and comes into contact with the output electrode.

3. The semiconductor device according to claim 2, wherein the first semiconductor region forms an ohmic contact with the output electrode.

4. The semiconductor device according to claim 1, wherein the layer that reduces the leakage current is a second semiconductor region that is a second conduction type, is provided in a surface layer of the second main surface of the semiconductor substrate, and comes into contact with the output electrode.

5. The semiconductor device according to claim 1, wherein the layer that reduces the leakage current is an insulating film that covers the first main surface of the semiconductor substrate.

6. The semiconductor device according to claim 1, wherein the layer that reduces the leakage current is an auxiliary electrode that is electrically connected to the output electrode.

7. The semiconductor device according to claim 2, wherein the layer that reduces the leakage current includes:
an insulating film that covers the first main surface of the semiconductor substrate; and
an auxiliary electrode that comes into contact with the output electrode and is provided so as to extend from the output electrode to a surface of the insulating film, and
the auxiliary electrode comes into contact with the first semiconductor region which is exposed from the first main surface of the semiconductor substrate.

8. The semiconductor device according to claim 7, wherein the layer that reduces the leakage current further includes a second semiconductor region that is a second conduction type, is provided in a surface layer of the second main surface of the semiconductor substrate, and comes into contact with the output electrode.

9. The semiconductor device according to claim 1, wherein the output electrode extends from the second main surface to the first main surface of the semiconductor substrate and is laid across the outer circumferential edge of the first main surface.

10. The semiconductor device according to claim 1, wherein the semiconductor substrate is made of silicon carbide or gallium nitride.

11. The semiconductor device according to claim 2, wherein the semiconductor substrate is made of silicon carbide or gallium nitride.

12. The semiconductor device according to claim 3, wherein the semiconductor substrate is made of silicon carbide or gallium nitride.

13. The semiconductor device according to claim 4, wherein the semiconductor substrate is made of silicon carbide or gallium nitride.

14. The semiconductor device according to claim 5, wherein the semiconductor substrate is made of silicon carbide or gallium nitride.

15. The semiconductor device according to claim 6, wherein the semiconductor substrate is made of silicon carbide or gallium nitride.

16. The semiconductor device according to claim 7, wherein the semiconductor substrate is made of silicon carbide or gallium nitride.

17. The semiconductor device according to claim 8, wherein the semiconductor substrate is made of silicon carbide or gallium nitride.

18. The semiconductor device according to claim 9, wherein the semiconductor substrate is made of silicon carbide or gallium nitride.

* * * * *